US011391766B2

(12) United States Patent
Schoenman et al.

(10) Patent No.: US 11,391,766 B2
(45) Date of Patent: *Jul. 19, 2022

(54) WIRE DOWN DETECTION SYSTEM AND METHOD (71) Applicant: PACIFIC GAS AND ELECTRIC COMPANY, San Francisco, CA (US)

(72) Inventors: Eric Michael Schoenman, San Francisco, CA (US); Wei Li, Foster City, CA (US); Sophia Chen, Pacifica, CA (US); Daniel Marlowe Partridge, El Cerrito, CA (US); James Louis Meadows, Lafayette, CA (US); Thomas Frank Martin, Oakland, CA (US)

(73) Assignee: PACIFIC GAS AND ELECTRIC COMPANY, San Francisco, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/134,883

(22) Filed: Dec. 28, 2020

(65) Prior Publication Data
US 2021/0223303 A1 Jul. 22, 2021

Related U.S. Application Data (63) Continuation of application No. 15/872,771, filed on Jan. 16, 2018, now Pat. No. 10,877,083.
(Continued)

(51) Int. Cl.
*G06F 11/30* (2006.01)
*G01R 31/08* (2020.01)
(Continued)

(52) U.S. Cl.
CPC ....... *G01R 31/085* (2013.01); *G01R 19/2513* (2013.01); *G01R 22/063* (2013.01);
(Continued)

(58) Field of Classification Search
CPC .................................................. G01R 31/085
See application file for complete search history.

(56) References Cited

U.S. PATENT DOCUMENTS 10,877,083 B2 * 12/2020 Schoenman .............. H02J 3/00
2008/0088464 A1 * 4/2008 Gutierrez .............. G01F 15/063
340/606
(Continued)

FOREIGN PATENT DOCUMENTS

KR   10-2008-0001000 A   1/2008
KR      20-0439399 Y1   4/2008
KR      10-1649897 B1   8/2016

OTHER PUBLICATIONS

International Search Report for International Application No. PCT/US2018/052983, dated Jan. 11, 2019, 3 pages.
(Continued)

*Primary Examiner* — Phuong Huynh
(74) *Attorney, Agent, or Firm* — Greenberg Traurig, LLP (57) ABSTRACT Some embodiments of the invention include a method and system for metering an electrical grid comprising at least one processor executing instructions from a non-transitory computer-readable storage medium of an electrical grid fault detection system. In some embodiments of the system, the instructions cause a processor to calculate a prediction of whether power delivery to at least a portion of the electrical grid is functioning abnormally using voltage sensing devices coupled to at least one feeder, where one or more of the voltage sensing devices are responsive to a determination that the power delivery is functioning abnormally. Further in some embodiments, the determination includes the electrical grid fault detection system receiving at least one signal or voltage reading from the electrical grid based at least in part on a sensed or received voltage level or range of voltage level.

20 Claims, 5 Drawing Sheets

Related U.S. Application Data (60) Provisional application No. 62/446,142, filed on Jan. 13, 2017.

(51) Int. Cl.
  *G01R 22/10*   (2006.01)
  *H02J 13/00*   (2006.01)
  *G01R 19/25*   (2006.01)
  *G01R 22/06*   (2006.01)
  *H02J 3/00*    (2006.01)

(52) U.S. Cl.
  CPC ............ *G01R 22/10* (2013.01); *H02J 3/00* (2013.01); *H02J 13/0006* (2013.01); *H02J 13/00022* (2020.01); *H02J 13/0075* (2013.01); *Y02E 60/00* (2013.01); *Y04S 10/52* (2013.01); *Y04S 40/126* (2013.01)

(56) References Cited

U.S. PATENT DOCUMENTS

2015/0346250 A1   12/2015   Liu
2017/0045571 A1*  2/2017    Joseph ................ G01R 15/186

OTHER PUBLICATIONS

Written Opinion for International Application No. PCT/US2018/052983, dated Jan. 11, 2019, 7 pages.

\* cited by examiner

WIRE DOWN DETECTION SYSTEM AND METHOD

RELATED APPLICATIONS

This application is a continuation of U.S. application Ser. No. 15/872,771, entitled "WIRE DOWN DETECTION SYSTEM AND METHOD" filed on Jan. 16, 2018, which claims priority to U.S. provisional application Ser. No. 62/446,142, entitled "WIRE DOWN DETECTION SYSTEM AND METHOD" filed on Jan. 13, 2017, the entire contents of which are incorporated herein by reference.

BACKGROUND

Utilities often deploy automatic outage detection tools to indicate a power service outage. However, unless there is a customer hazard call, the utility company often cannot differentiate between an energized wire down or a complete power outage. The ability to more definitively identify the type of outage fault can contribute to improving overall safety standing with utility customers by reducing the time it takes to identify, secure, and repair any potentially hazardous faults. For example, overall safety can be increased by reducing the time it takes to identify, secure, and repair faults, and more accurately identify locations where there may be customer damage. Moreover, distribution or dispatch operators can prioritize restoration responses to locations with clearly identified safety hazards, such as those presented by a downed, energized wire.

SUMMARY

Some embodiments include a computer-implemented method of metering an electrical grid comprising at least one processor executing instructions from a non-transitory computer-readable storage medium of an electrical grid fault detection system. In some embodiments, the instructions cause a processor to calculate a prediction of whether power delivery to at least a portion of the electrical grid is functioning abnormally using electrical meters coupled to at least one feeder, where one or more of the electrical meters are responsive to a determination that the power delivery is functioning abnormally. In some embodiments, the response following the determination includes the electrical grid fault detection system receiving at least one signal or voltage reading from the electrical grid based at least in part on a sensed or received voltage level or range of voltage level.

In some embodiments, the computer-implemented method includes querying one or more of the electrical meters, where the querying precedes the receipt of the signal or voltage from at least one electrical meter, and the signal or voltage is at least partially based on the query. In some embodiments, asynchronous communication of abnormal voltage by one or more devices may be followed by querying additional devices for supplemental analytical data including, but not limited to, voltage, voltage range, or device state. In some further embodiments, the functioning abnormally includes a voltage change above or below the voltage level or range of voltage level. In other embodiments, the functioning abnormally includes a power failure event. In some further embodiments, the functioning abnormally is indicative of a downed wire that is energized. In some other embodiments, the functioning abnormally is indicative of a downed wire that is not energized.

In some embodiments, the signal or voltage reading originates from an electrical meter coupled to a single transformer of the electrical grid. In some embodiments, the signal or voltage reading originates from two or more electrical meters coupled to the same transformer of the electrical grid. In some further embodiments, the functioning abnormally is indicative of the voltage level or range of voltage level being about 75% to 90% of nominal. In other embodiments, the functioning abnormally is indicative of the voltage level or range of voltage level being about 25% to 75% of nominal. In some embodiments, the functioning abnormally is indicative of the voltage level or range of voltage level being less than about 25% of nominal.

In some embodiments, the determination includes an on-demand read of the electrical meters. In some embodiments, the determination includes an on-demand read of a plurality of electrical meters, the plurality being a total of six meters plus 25% of the total number of meters of a feeder of the electrical grid. In some further embodiments, the on-demand read comprises a real-time or near real-time meter request for kWh usage data and voltage data. In some embodiments, the determination includes a check for the feeder being three-wire or four-wire.

In some embodiments, the functioning abnormally is a feedback condition comprising at least one of a broken wire, a burnt-out jumper, and a single fuse operating on a two or three wire line. In some further embodiments, the functioning abnormally is an arc detection with at least one of line sensors and substation relays, the line sensors providing at least one of fault location, real-time load, and verification of voltage present on one or all phases.

Some embodiments of the invention include a non-transitory computer-readable storage medium, storing instructions that, when executed, cause a processor to perform a computer-implemented method of operating an electrical grid comprising calculating a prediction of whether power delivery to at least a portion of the electrical grid is functioning abnormally using electrical meters coupled to at least one feeder, where one or more of the electrical meters are responsive to a determination that the power delivery is functioning abnormally. In some embodiment of the medium, the determination includes the electrical grid fault detection system receiving at least one signal or voltage reading from the electrical grid based at least in part on a sensed or received voltage level or range of voltage level.

Some further embodiments of the invention include a system for metering an electrical grid comprising at least one processor executing instructions from a non-transitory computer-readable storage medium of an electrical grid fault detection system. In some embodiments of the system, the instructions cause a processor to calculate a prediction of whether power delivery to at least a portion of the electrical grid is functioning abnormally using electrical meters coupled to at least one feeder, where one or more of the electrical meters are responsive to a determination that the power delivery is functioning abnormally. Further in some embodiments, the determination includes the electrical grid fault detection system receiving at least one signal or voltage reading from the electrical grid based at least in part on a sensed or received voltage level or range of voltage level.

DETAILED DESCRIPTION

Before any embodiments of the invention are explained in detail, it is to be understood that the invention is not limited in its application to the details of construction and the arrangement of components set forth in the following description or illustrated in the following drawings. The invention is capable of other embodiments and of being practiced or of being carried out in various ways. Also, it is to be understood that the phraseology and terminology used herein is for the purpose of description and should not be regarded as limiting. The use of "including," "comprising," or "having" and variations thereof herein is meant to encompass the items listed thereafter and equivalents thereof as well as additional items. Unless specified or limited otherwise, the terms "mounted," "connected," "supported," and "coupled" and variations thereof are used broadly and encompass both direct and indirect mountings, connections, supports, and couplings. Further, "connected" and "coupled" are not restricted to physical or mechanical connections or couplings.

The following discussion is presented to enable a person skilled in the art to make and use embodiments of the invention. Various modifications to the illustrated embodiments will be readily apparent to those skilled in the art, and the generic principles herein can be applied to other embodiments and applications without departing from embodiments of the invention. Thus, embodiments of the invention are not intended to be limited to embodiments shown, but are to be accorded the widest scope consistent with the principles and features disclosed herein. The following detailed description is to be read with reference to the figures, in which like elements in different figures have like reference numerals. The figures, which are not necessarily to scale, depict selected embodiments and are not intended to limit the scope of embodiments of the invention. Skilled artisans will recognize the examples provided herein have many useful alternatives and fall within the scope of embodiments of the invention.

Some embodiments include methods for analysis of events and notifications generated by an electrical meter (e.g., such as a "smart" meter) during outages. In some embodiments, the system and methods include using data from smart electrical meter and system configurations to enhance distribution operator's ability to quickly identify hazardous energized wire down situations. In some embodiments, the method can enable rapid identification of primary distribution energized wire down locations. In some embodiments, the methods of the invention can use signals and retrieved operational states from one or more meters to interpret the actual energized state of meters involved in an outage. In some embodiments of the invention, any electrical meter described herein can be a voltage sensing device. In some embodiments, any of the embodiments described herein can utilized one or more voltage sensing devices.

In some embodiments, the electrical meters can be one or more advanced metering infrastructure meters. For example, some embodiments include AMI/SmartMeters™, although the methods described herein do not need to rely on the use of AMI/SmartMeters™. For example, some embodiments can use any device configured to be interrogated and/or provide information as described herein for AMI/SmartMeters™. In some embodiments, outage identification methods can be applied to any utility deploying AMI/SmartMeters™. Some embodiments can utilize AMI/SmartMeter™ feature enhancements that can improve the functionality of the product. In some further embodiments, data can be retrieved from other sources such as, but not limited to, individual line sensors and/or relays. In some further embodiments, the values of line sensors can include, but not be limited to, fault location, real time load for switching decisions, voltage, and verification of voltage present on one or all phases.

In some embodiments, by using one or more SmartMeters™, the type of outage can be predicted. Some embodiments can use data derived from or based on the state one or more SmartMeters™ to predict estimate the type of outage. For example, some embodiments include estimation or prediction of an energized wire down outage (e.g., an outage involving a down wire that is live and still carrying voltage and/or current). Other embodiments include estimation or prediction of an energized wire down outage involving a down wire that is not energized.

In some embodiments of the invention, the systems and methods described herein can determine the type and location of tap and fuse level outages to and/or within a transformer. In some embodiments, using a combination of specific traps and events, queries from the meter, and expert knowledge of electrical primary and secondary distribution infrastructure, specific events can be isolated to specific distribution equipment location. In some embodiments, any specific detected event can be categorized as energized or not energized. In some embodiments, the meter and/or the system and method can prioritize responses to hazard calls by indicating more or less likely actual problem locations.

In some embodiments of the invention, some meters (e.g., such as smart meters, including the aforementioned AMI/SmartMeters™) can respond with data when the meter voltage is less than 50%. In some embodiments of the invention, although voltage cannot be queried, the meter can allow an operator to know when supplied voltage is either normal, partial, or de-energized (i.e., when there is no response). In some embodiments of the invention, this can indicate a back-feed condition which can include, but not be limited to, a broken wire, a burnt-out jumper, or a situation where only one fuse has operated on a two or three wire line. In some embodiments, arcing detection can be used to determine if there is an energized wire is down, however there is no way to differentiate between an open wire and an un-energized wire down. In some embodiments, arc detection can be possible with line sensors and substation relays.

Table 1 shows meter voltage summary information according to some embodiments of the invention:

TABLE 1

Smart meter voltage response

| Voltage or Voltage Range | AMI Meter | Importance |
| --- | --- | --- |
| About 90% and above | Normal communications and fully operational meter | Confirms meters are fully energized |
| About 75% to about 90% | Voltage sag | Possible high load and/or overloaded circuit |

TABLE 1-continued

Smart meter voltage response

| Voltage or Voltage Range | AMI Meter | Importance |
|---|---|---|
| About 25% to 75% | Normal communications, but meter stops operating | Confirms meters are in a back-feed condition |
| Less than about 25% | Total loss of communication | Implies meters are fully de-energized |

In reference to Table 1 showing meter voltage summary information, in some embodiments of the invention, a combination of inputs including, but not limited to, meter traps, waveform arcing and phase shift data, and/or meter ping and read responses can be used to determine a high impedance fault detection. For example, in one non-limiting embodiment of the invention, a voltage of about 90% of nominal and above can indicate normal operations and a fully functional meter, and can be used to confirm the meter is fully energized. Further, in some embodiments, a voltage range of between about 75% and 90% of nominal can indicate a voltage sag, and in some cases can be attributed to high load and/or an overloaded circuit. Further, in some embodiments, a voltage range of between 25% and 75% can be indicative of normal communications, but the can meter stop operating, and can indicate meters are in a back-feed condition. Further, in some embodiments, a voltage of less than about 25% of nominal can indicate a total loss of communication, and can imply meters are fully de-energized.

Figure 1:
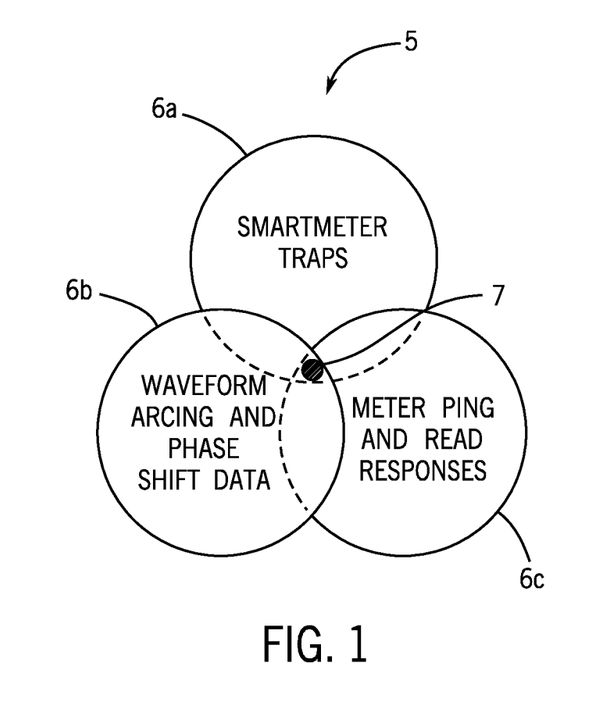
FIG. 1 illustrates a high impedance fault implementation according to some embodiments of the invention.

FIG. 1 illustrates a high impedance fault implementation 5 according to some embodiments of the invention. In some embodiments of the invention, the highest certainty can be obtained from an intersection (shown as the central data overlap marked as 7) of information/data comprising overlapping data circles including smart meter trap data 6a, waveform arcing and phase shift data 6b, and meter ping and read responses data 6c as illustrated in FIG. 1. In some embodiments of the invention, a combination of ping and read responses coupled with behaviors at different voltage levels can enable the determination of the nature of the broken wire condition.

Figure 2A:
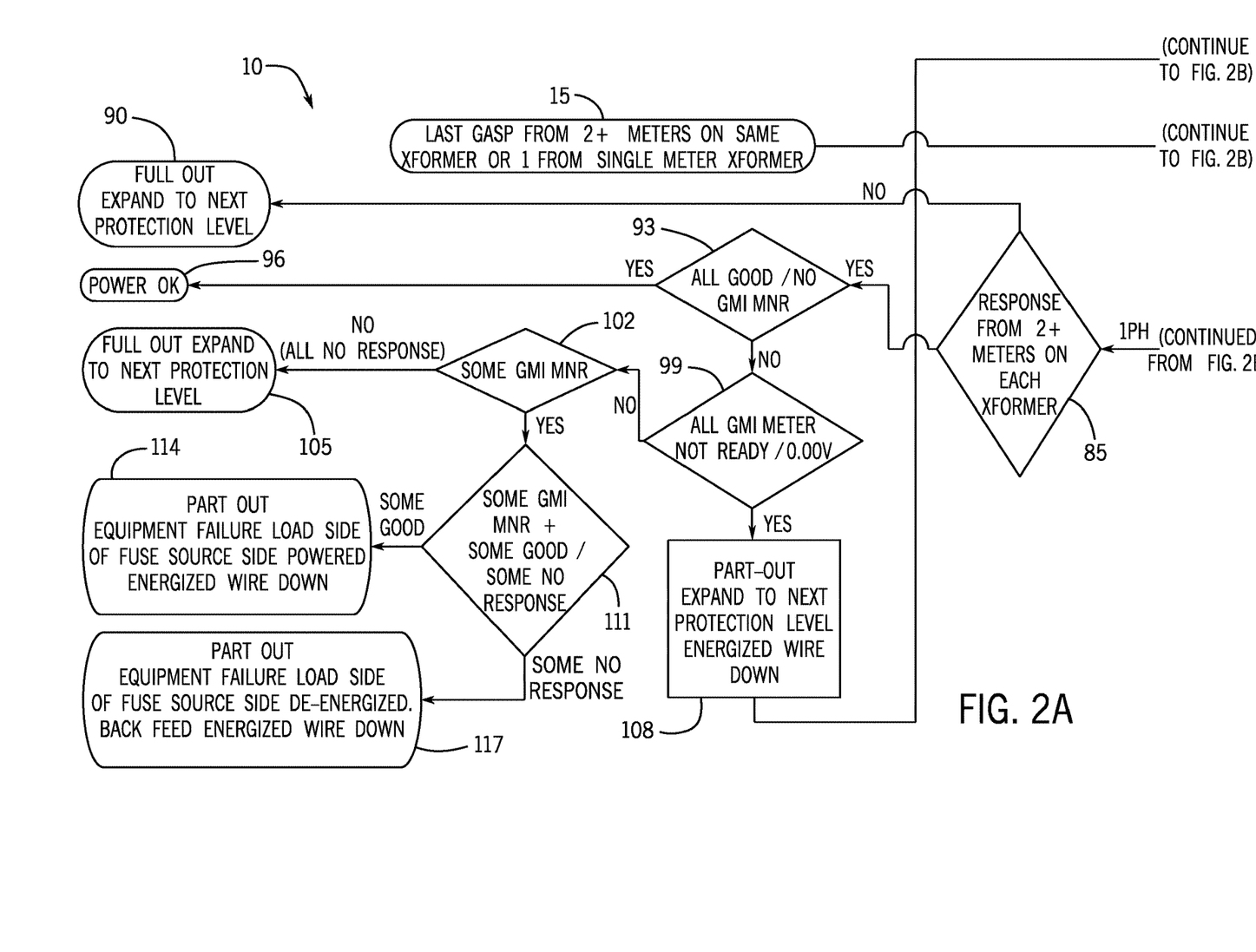
FIG. 2A illustrates a portion of a wire down determination system and method according to some embodiments of the invention.
Figure 2B:
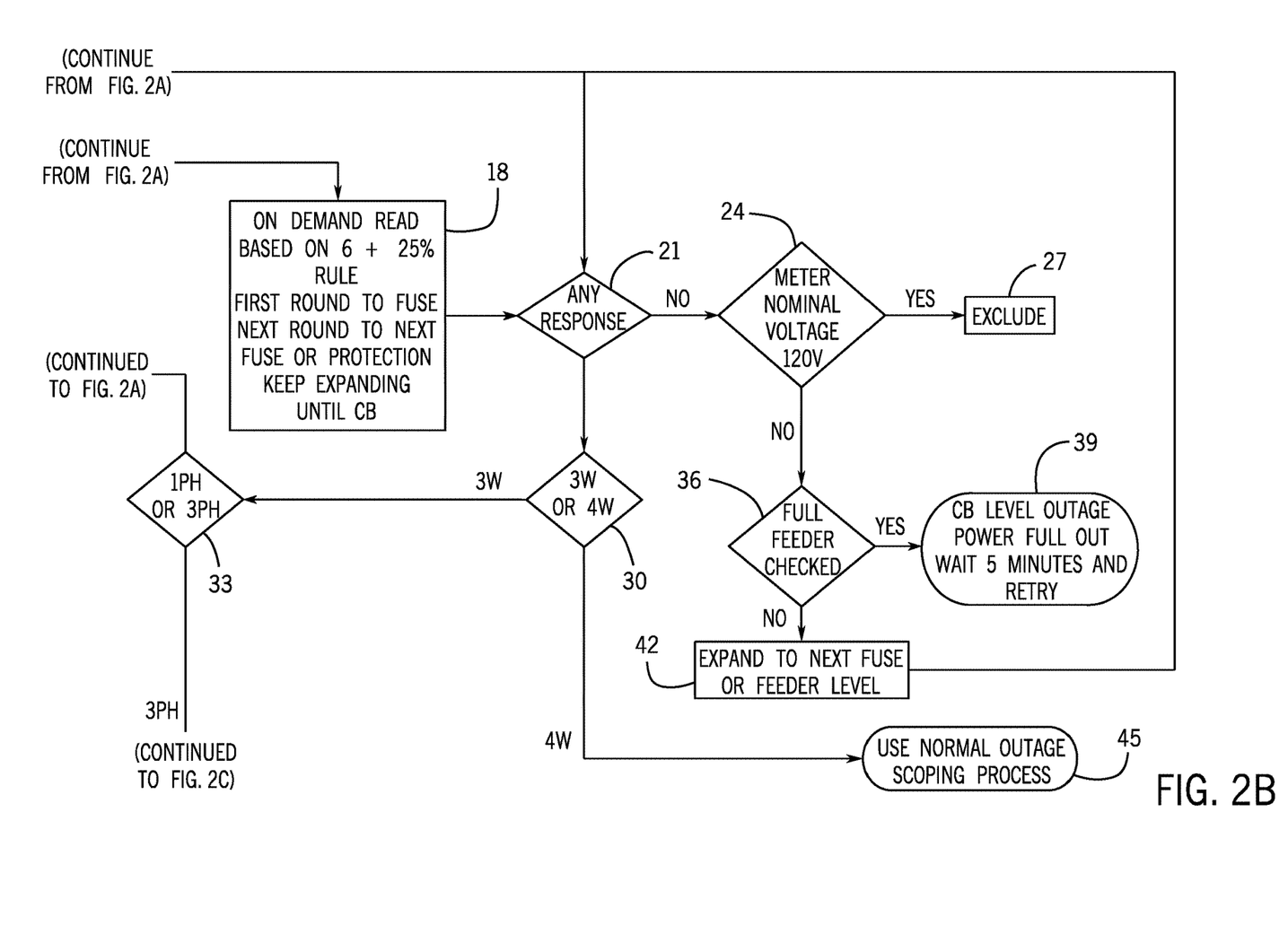
FIG. 2B illustrates a portion of a wire down determination system and method according to some embodiments of the invention.
Figure 2C:
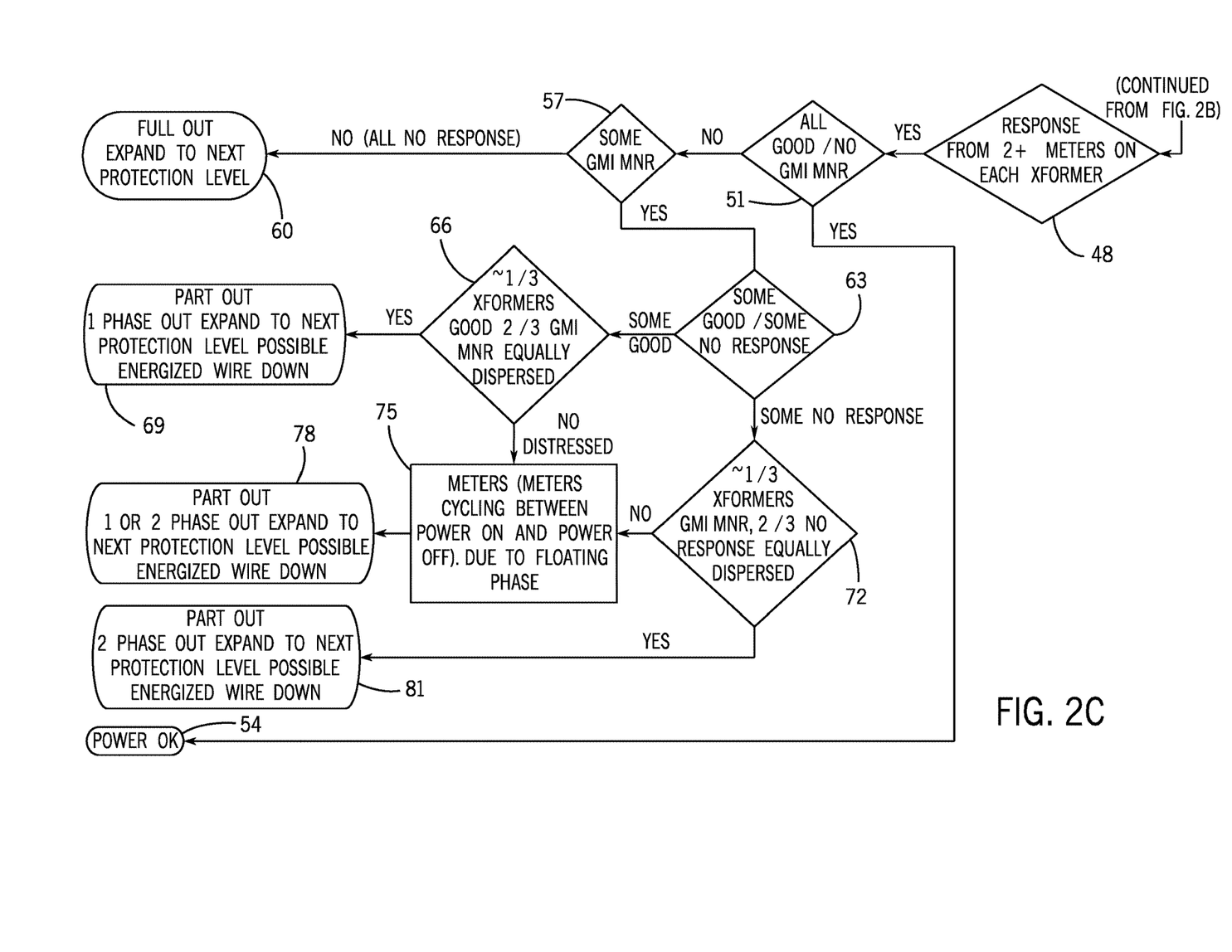
FIG. 2C illustrates a portion of a wire down determination system and method according to some embodiments of the invention.

FIGS. 2A-2C illustrates a wire down determination system and method 10 according to some embodiments of the invention. For example, FIG. 2A a portion of the wire down determination system and method 10 according to some embodiments of the invention, and FIG. 2B another portion of the wire down determination system and method 10 according to some embodiments of the invention. Further, FIG. 2C includes a final portion of the wire down determination system and method 10 according to some embodiments of the invention. Referring initially to FIG. 2A, step 15 includes a "last gasp from two or more meters on the same transformer and/or a last gasp from one meter on a single meter transfer". In this example embodiments, step 15 includes an embodiments where a last signal can be received from two or more meters on the same transformer. Further, step 15 includes an embodiments where a last signal can be received from a last gasp from one meter on a single meter transformer.

In some embodiments of the invention, the wire down determination system and method can use inbound last gasp messages from the meter (e.g., a real-time outage alert trap) to assess outage extent. In some embodiments of the invention, at a specific minimum threshold, outage identification can be initiated. For example, in some embodiments, initial traps can generally begin at about 25% to 50% of voltage.

In some embodiments, when traps from more than two meters on a transformer are received, an outage initiation process can begin by probing or reading a sample of meters coupled to the transformer. In some embodiments, the sample rate can be based on a formula that can be adjusted to define a level of confidence. For example, in the case where there are 20 meters, 11 meters are probed. Further, for example, referring to FIG. 2B, in some embodiments, step 18 includes "on demand read based on a six plus 25% rule. In this instance, data reads can include data from six meters plus 25% of the total number of meters on an identified transformer.

In some embodiments of the invention, outage scoping is started on a small scale, and then expanded to determine extent. In some embodiments, outages can be contained by protective devices such as fuses, and/or dynamic protection (re-closers, and/or sectionalizers). In this instance, probing can start on a section of circuit that has reported last gasps, and can check all of the transformers that are protected by the first upstream fuse in the feeder. In some embodiments, if it is determined that all of the meters in that investigation are in the same outage state (hence all on the same side of the circuit outage), probing can continue to the next upstream protective device on that feeder. In some embodiments, this process can continue until the whole feeder has been checked.

In some embodiments of the invention, the wire down determination system and method can sample the meter state. In some embodiments of the invention, the wire down determination system and method can request an on-demand read (e.g., a real time or nearly real time request for meter kWh usage and voltage) on a sampling basis, and using the total number of meters sample per transformer base on six meters, with minimum pulls of 25% of the total transformer meter count. In some embodiments, this sampling ratio can be used on each transformer scoped in the outage at each protection level. In some embodiments, step 21 can include "any response" where the wire down determination system and method can determine if there is any response from any of the sampled meters. In some embodiments, if there is no response from step 21, the wire down determination system and method can proceed with step 24 including a check "meter nominal voltage 120V", where the wire down determination system and method can determines if any of the sample meters are 120 VAC nominal (e.g., versus 240, 277V, or other nominal voltage). In some embodiments, these meters can have a different partout threshold.

In some embodiments, if there is a response, step 27 can include an "exclude" function, where the wire down determination system and method can exclude any meters that have 120V nominal voltages. Further, in some embodiments, if there is a response, the wire down determination system and method can proceed to a check step 30 that includes "3W or 4W", for three or four wire to the meter, with the feeder type 3 wire (no common neutral) or 4 wire (3-phase with common neutral).

In some embodiments of the invention, for a three wire system, check step 33 can include "1Ph or 3Ph" check for one phase or three phase power delivery, where the wire down determination system and method can determine if the feeder comprises a single phase tap or three phases. In some embodiments, for a four wire system, step 45 "use normal outage scoping process" can proceed with a recommendation for a normal outage scoping process where the wire down detection is not functional on four wire feeders.

In some embodiments of the invention, if there is a negative response to step 24, step 36 can include a "full feeder checked", where the wire down determination system and method can determine if the full feeder has been checked for outage. In some embodiments, for a positive response, the wire down determination system and method can proceed with step 39 "CB (circuit breaker) level outage power full out wait five minutes and re-entry" when there appears to be a full feeder outage. In some embodiments, the wire down determination system and method can wait five minutes to see if the circuit breaker resets, and can wait for the advanced metering infrastructure (AMI) mesh network to reform. In some embodiments, for a negative response, in step 42 "expand to next fuse or feeder level", the wire down determination system and method can determine if the full feeder has not been checked, and can continue to check for meter outage states in order to pinpoint outage and/or wire down location.

Referring to FIG. 2C, in some embodiments, the wire down determination system and method can proceed with step 48 that includes "response from two or more meters on each transformer". In this instance, with a minimum of two or more responses from interrogated meters per transformer, the wire down determination system and method can proceed with step 51 that includes "all good or not GMI MNR", where all meters respond back with full power on responses, and no meters in a part out state, which if positive, the wire down determination system and method can proceed with step 54 that includes "power ok". In this instance, the wire down determination system and method has determined that power is confirmed, and there is no outage at this protection point. In some other embodiments, if the wire down determination system and method determines that the answer to step 51 is negative, step 57 includes a test for "some GMI MNR", where the wire down determination system and method can determine if there is GMI MNR (and some good/no outage) indicating a mix of part out and no outage. GMI MNR is an on demand read respond indicating that the network interface card (NIC) is on, meter is off which indicates the meter is in a part out state. Further, GMI MNR equates to GMI meter not ready, which equates to the read response where a smart meter NIC is energized but the meter metrology board is not. This is the state indicating a part out, and generally occurs when voltage is between about 25% and 75%.

In some embodiments, if the wire down determination system and method determines the answer is negative, step 60 includes a "full out expand to next protection level". In this case, if it is determined that the initial protection outage level is in a full out state, the wire down determination system and method can continue to the next protection level (e.g., including, but not limited to fuse, dynamic protection, and substation circuit breaker evaluations). In some other embodiments, if the answer is positive, step 63 includes "some good or some no response", where the wire down determination system and method can determine if the mixture of meters is good (i.e., no outage), and/or if the meters show no response (full out) with GMI MNR (part out).

In some embodiments, if the wire down determination system and method determines there are some good meters, step 66 can include a "about a third transformers good two thirds GMI MNR equally dispersed" test, where the wire down determination system and method can determine the mix of meters with no outage and meters that are at least partly out. In some embodiments, a positive response includes step 69 that includes "part out 1 phase out expand to next protection level, possible energized wire down", with a determination of possible energized wire down, one phase out.

In some other embodiments of the invention, for a determination showing some or no response of step 63 includes "some good or some no response", where the wire down determination system and method can determine if the mixture of meters is good (i.e., no outage), and/or if the meters show no response (full out) with GMI MNR (part out), step 72 includes a determination of "about one third transformers GMI MNR, two thirds no response equally dispersed", where the wire down determination system and method can determine the mix of meters being full out and part out. In some embodiments, for a negative response, step 72 can determine step 75 "meters cycling between on and off due to a "floating phase" where for instances with floating phase, meters can cycle on off with change in customer loading. Further, in some embodiments, in step 78 that includes "part out one or two phase out, expand to next protection level possible energized wire down", the wire down determination system and method can determine if a possible energized wire down condition includes one or two phases out, and the analysis can expand to the next level to determine the extent of outage. Further, in some embodiments, for a positive response, step 72 can lead to step 81 which includes "part out two phase out expand to next protection level possible energized wire down", where the wire down determination system and method can determine a possible energized wire down with two phase down, and can expand analysis to the next level to determine the extent of the outage.

In some embodiments of the invention, for a three wire system, in the step 33, if the wire down determination system and method determines the feeder is a single phase tap, the wire down determination system and method (in step 85 of FIG. 2A) can make a determination "response from two plus meters on each transformer", where an assessment is made if there are a minimum of two or more responses from interrogated meters. In some embodiments, for a negative response, the wire down determination system and method can proceed to step 90 that includes "full out expand to next protection level", where it is determined that the initial protection outage level is in a full out state, and analysis can continue to the next protection level (fuse, dynamic protection, and/or substation circuit breaker).

In some embodiments, for a positive response to step 85, the wire down determination system and method can proceed with step 93 that includes "all good or no GMI MNR", to determine if all meters respond back with full power on responses, with no meters in a part out state. For a positive response, step 96 includes "power ok", providing a conclusion that there is no power outage.

In some embodiments, for a negative response, the wire down determination system and method can include a step 99 that includes "all GMI meter not ready/0.00V", with a determination if all meters respond back with GMI MNR and 0.00V for voltage level. In some embodiments, with a negative response to step 99, the wire down determination system and method can include step 102 that includes "some GMI MNR" to determine if some GMI MNR (and some good/no outage) indicating a mix of part out and no outage, where for all no response (i.e., it is determined that the initial protection outage level is in a full out state), the wire down determination system and method can proceed to step 105 that includes "full out expand to next protection level". In this instance, analysis can continue to the next protection level (fuse, dynamic protection, and/or substation circuit breaker). In some embodiments of the invention, for a positive response to step 99, step 108 includes "part out expand to next protection level energized wire down", where the wire down determination system and method has determined that the section of feeder is part out, and the wire down determination system and method can expand to next protection level (fuse, dynamic protection, and/or substation circuit breaker). For example, see the decision flow in FIG. 2B to steps 18 and 42.

In some embodiments, for a positive response to step 102, the wire down determination system and method can proceed with step 111 that includes "some GMI MNR plus some good/some no response" to determine the mix of GMI MNR and power OK, full out. In this instance, the step 111 can be used to determine location of down wire. In some instances, this can occur at a level above the transformer (i.e., meters on transformer will have same response but differences from meters on different transformers indicating a state change between locations). Further, with some good responses, the wire down determination system and method can proceed to step 114 that includes "part out equipment failure load side of fuse source side powered energized wire down", where the location of down wire is determined and wire down condition is determined as energized. Further, in some other embodiments, for a response of some no response, the wire down determination system and method can proceed with step 117 that includes "part out equipment failure load side of fuse source side de-energized back feed energized wire down", where the location of down wire is determined, and wire down condition is determined as energized back feed.

Figure 3:
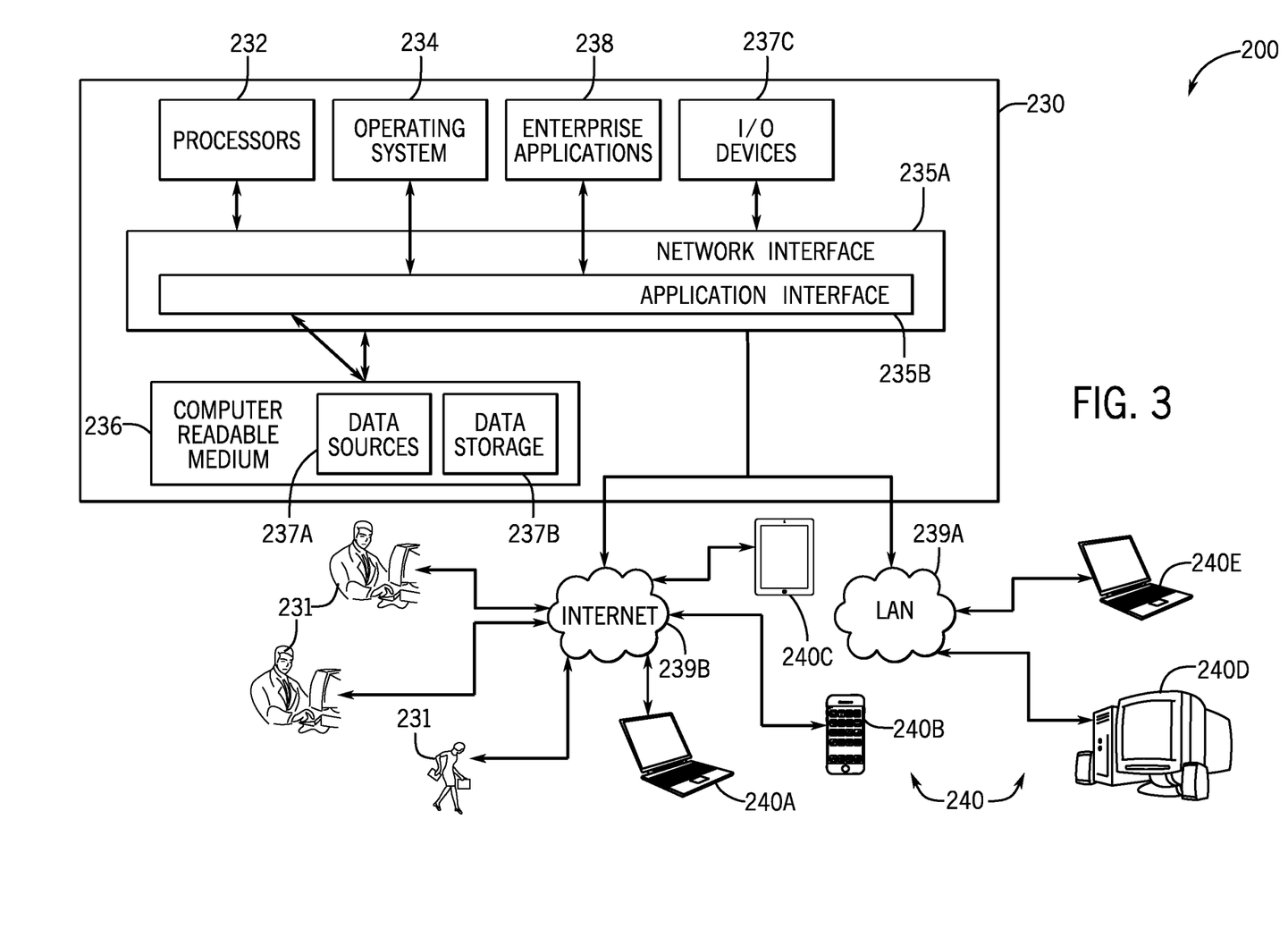
FIG. 3 illustrates a system for operating a wire down system and method in accordance with some embodiments of the invention.

In some embodiments of the invention, any of the meters, systems, or assemblies of a wire down system and method described herein can use at least one computing system within a networked metering or power network. For example, FIG. 3 shows an architecture diagram 200 of a system for operating a wire down system and method according to one embodiment of the invention. The diagram 200 shows one example of a system 230 for performing one or more of the methods of the wire down system that, as one non-limited example, can operate, read, send data and/or read data from one or more meters (e.g., such as smart meters described earlier). As shown, the system 230 can include at least one computing device, including one or more processors. Some processors can include processors 232 residing in one or more conventional server platforms. In some embodiments, the system 230 can include a network interface 235a and/or an application interface 235b coupled to at least one processor 232 capable of running at least one operating system 234, and one or more of the software modules 238 (e.g., such as enterprise applications). In some embodiments, the software modules 238 can include server-based software platform that can include wire down system and method software modules suitable for hosting at least one user account and at least one client account, as well as transferring data between one or more accounts.

Some embodiments of the invention relate to or include a device or an apparatus for performing these operations of the operating system 234 and/or the software modules 238. The apparatus can be specially constructed for the required purpose, such as a special purpose computer. In some embodiments, when defined as a special purpose computer, the computer can also perform other processing, program execution or routines that are not part of the special purpose, while still being capable of operating for the special purpose. Alternatively, in other embodiments, the operations can be processed by a general purpose computer selectively activated or configured by one or more computer programs stored in the computer memory, cache, or obtained over a network. In some embodiments, when data are obtained over a network, the data can be processed by other computers on the network, e.g. a cloud of computing resources.

With the above embodiments in mind, it should be understood that the invention can employ various computer-implemented operations involving wire down system and method data stored in computer systems. Moreover, in some embodiments, the above-described databases and models throughout the wire down system and method can store analytical models and other data on computer-readable storage media within the system 230 and on computer-readable storage media coupled to the system 230. In addition, in some embodiments, the above-described applications of the wire down system and method system can be stored on computer-readable storage media within the system 230 and on computer-readable storage media coupled to the system 230. These operations are those requiring physical manipulation of physical quantities. Usually, though not necessarily, these quantities take the form of electrical, electromagnetic, or magnetic signals, optical or magneto-optical form capable of being stored, transferred, combined, compared and otherwise manipulated.

Some embodiments include the system 230 comprising at least one computer readable medium 236 coupled to at least one data storage device 237b, and/or at least one data source 237a, and/or at least one input/output device 237c. In some embodiments, the invention embodied by the wire down system and method can be embodied as computer readable code on a computer readable medium 236. In some embodiments, the computer readable medium 236 can be any data storage device that can store data, which can thereafter be read by a computer system (such as the system 230). Examples of the computer readable medium 236 can include hard drives, network attached storage (NAS), read-only memory, random-access memory, FLASH based memory, CD-ROMs, CD-Rs, CD-RWs, DVDs, magnetic tapes, other optical and non-optical data storage devices, or any other physical or material medium which can be used to tangibly store the desired information or data or instructions and which can be accessed by a computer or processor (including processors 232).

In some embodiments of the invention, the computer readable medium 236 can also be distributed over a conventional computer network via the network interface 235a so that the wire down system and method embodied by the computer readable code can be stored and executed in a distributed fashion. For example, in some embodiments, one or more components of the system 230 can be tethered to send and/or receive data through a local area network ("LAN") 239a. In some further embodiments, one or more components of the system 230 can be tethered to send or receive data through an internet 239b (e.g., a wireless internet). In some embodiments, at least one software application 238 running on one or more processors 232 can be configured to be coupled for communication over a network 239a, 239b. In some embodiments, one or more components of the network 239a, 239b can include one or more resources for data storage, including any other form of computer readable media beyond the media 236 for storing information and including any form of computer readable media for communicating information from one electronic device to another electronic device.

In some embodiments of the invention, the network 239a, 239b can include wide area networks ("WAN"), direct connections (e.g., through a universal serial bus port) or other forms of computer-readable media 236, or any combination thereof. Further, in some embodiments, one or more components of the network 239*a*, 239*b* can include a number of client devices which can be personal computers 240 including for example desktop computers 240*d*, laptop computers 240*a*, 240*e*, digital assistants and/or personal digital assistants (shown as 240*c*), cellular phones or mobile phones or smart phones (shown as 240*b*), pagers, digital tablets, internet appliances, and other processor-based devices. In general, a client device can be any type of external or internal devices such as a mouse, a CD-ROM, DVD, a keyboard, a display, or other input or output devices 237*c*. In some embodiments, various other forms of computer-readable media 236 can transmit or carry instructions to a computer 240, including a router, private or public network, or other transmission device or channel, both wired and wireless. In some embodiments, the software modules 238 can be configured to send and receive data from a database (e.g., from a computer readable medium 236 including data sources 237*a* and data storage 237*b* that can comprise a database), and data can be received by the software modules 238 from at least one other source. In some embodiments, at least one of the software modules 238 can be configured within the system to output data to a user 231 via at least one smart meter (e.g., to a computer 240 comprising a smart meter).

In some embodiments, the system 230 as described above can enable one or more users 231 to receive, analyze, input, modify, create and send data to and from the system 230, including to and from one or more enterprise applications 238 running on the system 230. Some embodiments include at least one user 231 coupled to a computer 240 accessing one or more modules of the wire down system and method including at least one enterprise applications 238 via a stationary I/O device 237*c* through a LAN 239*a*. In some other embodiments, the system 230 can enable at least one user 231 (through computer 240) accessing enterprise applications 238 via a stationary or mobile I/O device 237*c* through an internet 239*a*.

Some embodiments can include variations of the order of any steps of the methods described herein. In some further embodiments, any of the wire down identification methods described herein can utilize larger or smaller numbers of customer data and/or with data from more or less numbers of customer meters. In some embodiments, voltage or other power data can include characteristics, limits, or behavior that is different from that described.

Some embodiments can also be defined as a machine that transforms data from one state to another state. In some embodiments, the data can represent an article, that can be represented as an electronic signal and electronically manipulate data. In some embodiments, the transformed data can, in some cases, be visually depicted on a display, representing the physical object that results from the transformation of data. In some embodiments, the transformed data can be saved to storage generally or in particular formats that enable the construction or depiction of a physical and tangible object. In some embodiments, the manipulation can be performed by a processor. In such an example, the processor thus transforms the data from one thing to another. Still further, the methods can be processed by one or more machines or processors that can be connected over a network. Each machine can transform data from one state or thing to another, and can also process data, save data to storage, transmit data over a network, display the result, or communicate the result to another machine. Computer-readable storage media, as used herein, refers to physical or tangible storage (as opposed to signals) and includes without limitation volatile and non-volatile, removable and non-removable storage media implemented in any method or technology for the tangible storage of information such as computer-readable instructions, data structures, program modules or other data.

Although method operations can be described in a specific order, it should be understood that other housekeeping operations can be performed in between operations, or operations can be adjusted so that they occur at slightly different times, or can be distributed in a system which allows the occurrence of the processing operations at various intervals associated with the processing, as long as the processing of the overlay operations are performed in the desired way.

It will be appreciated by those skilled in the art that while the invention has been described above in connection with particular embodiments and examples, the invention is not necessarily so limited, and that numerous other embodiments, examples, uses, modifications and departures from the embodiments, examples and uses are intended to be encompassed by the description herein.

The invention claimed is:

1. A computer-implemented method of metering an electrical grid comprising:
at least one processor executing instructions from a non-transitory computer-readable storage medium of an electrical grid fault detection system, the instructions causing a processor to:
calculate a prediction of whether power delivery to at least a portion of the electrical grid is functioning abnormally using electrical meters coupled to at least one feeder, wherein one or more of the electrical meters are responsive to a determination that the power delivery is functioning abnormally, wherein a response following the determination includes the electrical grid fault detection system receiving at least one signal or voltage reading from the electrical grid based at least in part on a sensed or received voltage level or range of voltage level.

2. The computer-implemented method of claim 1, wherein the determination includes querying one or more of the electrical meters, the querying preceding a receipt of the at least one signal or voltage reading from at least one of the electrical meters, and the at least one signal or voltage reading is at least partially based on the querying.

3. The computer-implemented method of claim 1, wherein the at least one signal or voltage reading from at least one of the electrical meters is received passively.

4. The computer-implemented method of claim 1, wherein the functioning abnormally includes a voltage change above or below the sensed or received voltage level or range of voltage level.

5. The computer-implemented method of claim 1, wherein the functioning abnormally includes a power failure event.

6. The computer-implemented method of claim 1, wherein the functioning abnormally is indicative of a downed wire that is energized.

7. The computer-implemented method of claim 1, wherein the functioning abnormally is indicative of a downed wire that is not energized.

8. The computer-implemented method of claim 1, wherein the at least one signal or voltage reading originates from an electrical meter coupled to a single transformer of the electrical grid.

9. The computer-implemented method of claim 1, wherein the at least one signal or voltage reading originates from two or more electrical meters coupled to a same transformer of the electrical grid.

10. The computer-implemented method of claim 1, wherein the functioning abnormally is indicative of the sensed or received voltage level or range of voltage level being about 75% to 90% of nominal.

11. The computer-implemented method of claim 1, wherein the functioning abnormally is indicative of the voltage level or range of voltage level being about 25% to 75% of nominal.

12. The computer-implemented method of claim 1, wherein the functioning abnormally is indicative of the sensed or received voltage level or range of voltage level being less than about 25% of nominal.

13. The computer-implemented method of claim 1, wherein the determination includes an on-demand read of the electrical meters.

14. The computer-implemented method of claim 1, wherein the determination includes an on-demand read of a plurality of electrical meters, the plurality of electrical meters being a total of six meters plus 25% of a total number of meters of a feeder of the at least one feeder of the electrical grid.

15. The computer-implemented method of claim 14, wherein the on-demand read comprises a real-time or near real-time meter request for kWh usage data and voltage data.

16. The computer-implemented method of claim 1, wherein the determination includes a check for the at least one feeder being three-phase or four-phase.

17. The computer-implemented method of claim 1, wherein the functioning abnormally is a feedback condition comprising at least one of a broken wire, a burnt-out jumper, and a single fuse operating on a two or three wire line.

18. The computer-implemented method of claim 1, wherein the functioning abnormally is an arc detection with at least one of line sensors and substation relays, the line sensors providing at least one of fault location, real-time load, and verification of voltage present on one or all phases.

19. A non-transitory computer-readable storage medium, storing instructions that, when executed, cause a processor to perform a computer-implemented method of operating an electrical grid comprising:
   calculating a prediction of whether power delivery to at least a portion of the electrical grid is functioning abnormally using electrical meters coupled to at least one feeder, wherein one or more of the electrical meters are responsive to a determination that the power delivery is functioning abnormally, wherein the determination includes:
   an electrical grid fault detection system receiving at least one signal or voltage reading from the electrical grid based at least in part on a sensed or received voltage level or range of voltage level.

20. A system for metering an electrical grid comprising:
   at least one processor executing instructions from a non-transitory computer-readable storage medium of an electrical grid fault detection system, the instructions causing a processor to:
   calculating a prediction of whether power delivery to at least a portion of the electrical grid is functioning abnormally using electrical meters coupled to at least one feeder, wherein one or more of the electrical meters are responsive to a determination that the power delivery is functioning abnormally, wherein the determination includes:
   the electrical grid fault detection system receiving at least one signal or voltage reading from the electrical grid based at least in part on a sensed or received voltage level or range of voltage level.

* * * * *